(12) United States Patent
Tay et al.

(10) Patent No.: US 8,513,801 B2
(45) Date of Patent: Aug. 20, 2013

(54) INTEGRATED CIRCUIT PACKAGE SYSTEM

(75) Inventors: Lionel Chien Hui Tay, Singapore (SG); Jairus Legaspi Pisigan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 653 days.

(21) Appl. No.: 12/193,540

(22) Filed: Aug. 18, 2008

(65) Prior Publication Data
US 2010/0038761 A1 Feb. 18, 2010

(51) Int. Cl.
*H01L 23/34* (2006.01)

(52) U.S. Cl.
USPC .......................................... 257/723; 257/778

(58) Field of Classification Search
CPC . H01L 25/043; H01L 25/0657; H01L 25/074; H01L 21/8221
USPC .................. 257/E23.168, E23.169, E23.175, 257/E23.011, E23.067, E23.151, 686, 778, 257/685, 723, 724, 774; 361/748, 760, 761, 361/784, 796, 792
See application file for complete search history.

(56) References Cited

U.S. PATENT DOCUMENTS

| | | | |
|---|---|---|---|
| 6,414,396 B1 | 7/2002 | Shim et al. | |
| 7,211,883 B2 | 5/2007 | Oka et al. | |
| 7,218,001 B2 | 5/2007 | Seng | |
| 7,364,945 B2 | 4/2008 | Shim et al. | |
| 2006/0138649 A1* | 6/2006 | Karnezos | 257/723 |
| 2007/0216010 A1 | 9/2007 | Yim et al. | |
| 2007/0218689 A1* | 9/2007 | Ha et al. | 438/686 |

* cited by examiner

*Primary Examiner* — N Drew Richards
*Assistant Examiner* — Yu-Hsi D Sun
(74) *Attorney, Agent, or Firm* — Ishimaru & Associates LLP

(57) ABSTRACT

An integrated circuit package system includes: mounting a first integrated circuit over a carrier; mounting an interposer, having an opening, over the first integrated circuit and the carrier with the interposer having an overhang over the carrier; connecting an internal interconnect, through the opening, between the carrier and the interposer; and forming an encapsulation over the first integrated circuit, the internal interconnect, and the carrier.

20 Claims, 5 Drawing Sheets

US 8,513,801 B2

INTEGRATED CIRCUIT PACKAGE SYSTEM

TECHNICAL FIELD

The present invention relates generally to an integrated circuit package system and more particularly to an integrated circuit package system with an interposer.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP). POP design using resin encapsulation require special or custom mold chase for forming cavity or recesses in the resin encapsulation. Alternatively, specialized dam structures can be used with planar mold chases to form the cavity or recess in the resin encapsulation. Both processes add steps and complexity to the manufacturing of the package. Even designs that are not POP but requiring a window in the resin encapsulation also struggle with the same challenges as stated.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including mounting a first integrated circuit over a carrier; mounting an interposer, having an opening, over the first integrated circuit and the carrier with the interposer having an overhang over the carrier; connecting an internal interconnect, through the opening, between the carrier and the interposer; and forming an encapsulation over the first integrated circuit, the internal interconnect, and the carrier.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
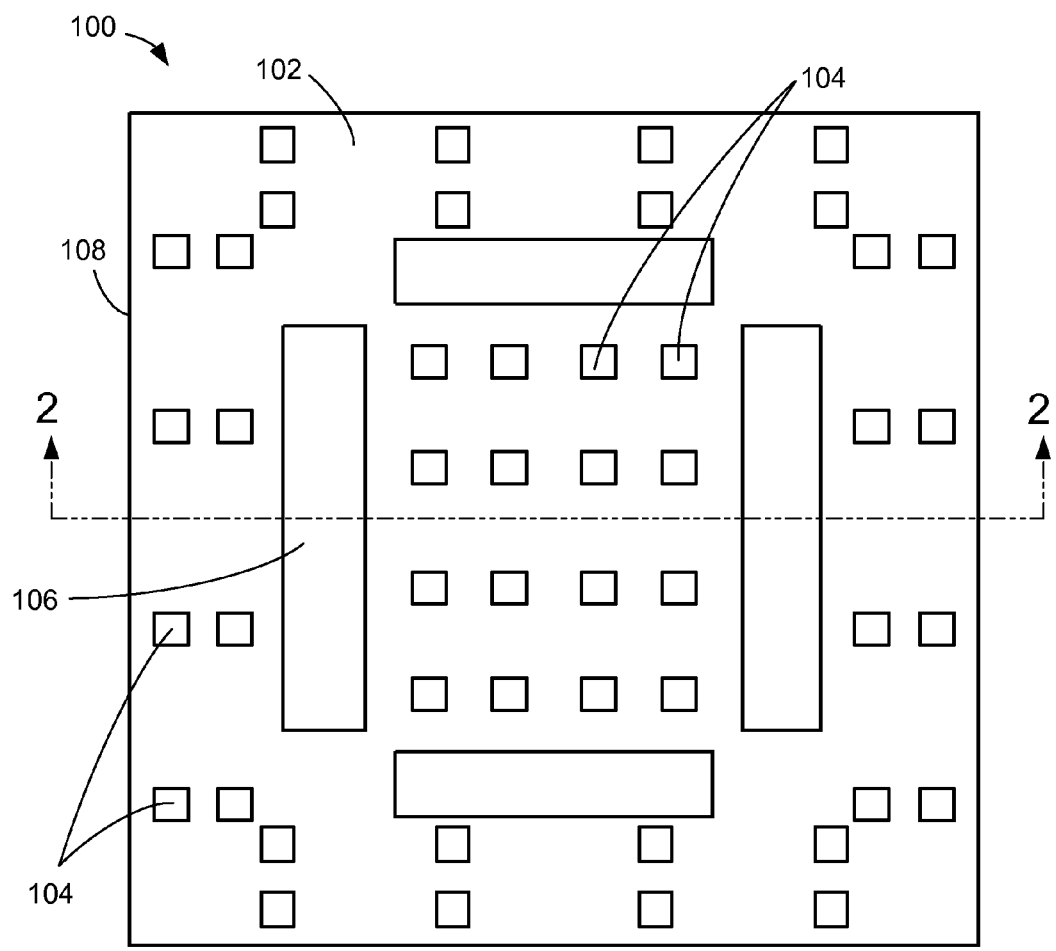
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts an interposer 102, such as a laminated substrate, having terminal pads 104. The interposer 102 can include encapsulation protrusions 106 positioned along sides 108 of the interposer 102.

For illustrative purposes, the integrated circuit package system 100 is shown with the encapsulation protrusions 106 along each of the sides 108 of the interposer 102, although it is understood that the integrated circuit package system 100 can have different configurations for the encapsulation protrusions 106. For example, the integrated circuit package system 100 can have the encapsulation protrusions 106 not along all the sides 108 of the interposer 102.

Also for illustrative purposes, the integrated circuit package system 100 is shown with the encapsulation protrusions 106 having the same or similar dimensions to each other, although it is understood that the integrated circuit package system 100 can have the encapsulation protrusions 106 with different shape and positioning from each other. Further for illustrative purposes, the integrated circuit package system 100 is shown with the encapsulation protrusions 106 positioned parallel to the sides 108 of the interposer 102, although it is understood that the one or more of the encapsulation protrusions 106 may not be parallel to the sides 108 or can be at an obtuse angle to at least one of the sides 108 of the interposer 102.

Figure 2:
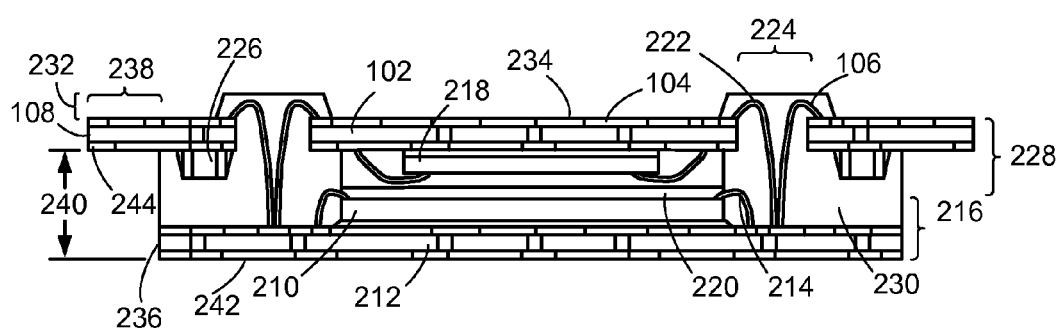
FIG. 2 is a cross-sectional view of the integrated circuit package system along line 2-2 of FIG. 1.

Referring now to FIG. 2, therein is showing a cross-sectional view of the integrated circuit package system 100 along line 2-2 of FIG. 1. A first integrated circuit 210, such as an integrated circuit die, can be over a carrier 212, such as a laminated substrate. A first internal interconnect 214, such as bond wire, can connect the carrier 212 to the first integrated circuit 210. A carrier assembly 216 can include the first integrated circuit 210, the carrier 212 and the first internal interconnect 214.

A second integrated circuit 218, such as a packaged integrated circuit, can be over the first integrated circuit 210 with an adhesive 220, such as a wire in film adhesive including a B-stage material, in between. The adhesive 220 can surround a portion of the first internal interconnect 214 adjacent to the connection with the first integrated circuit 210.

The interposer 102 can be over the second integrated circuit 218. A second internal interconnect 222, such as a bond wire or ribbon bond wire, can connect the interposer 102 with the carrier 212 through openings 224 in the interposer 102. The carrier 212 can extend laterally beyond the openings 224 in the interposer 102. An internal device 226, such as a passive component, can be attached to and under the interposer 102. For illustrative purposes, the integrated circuit package system 100 is shown with the internal device 226 adjacent to the sides 108 of the interposer 102, although it is understood that the internal device 226 can be located elsewhere in the integrated circuit package system 100. For example, the internal device 226 can be over the carrier 212. The internal device 226 can be optional. An interposer assembly 228 can include the second integrated circuit 218, the interposer 102, the adhesive 220 and the internal device 226.

An encapsulation 230, such as a cover including an epoxy molding compound, can be over the carrier 212 covering the second integrated circuit 218, the first integrated circuit 210, the first internal interconnect 214, the second internal interconnect 222, and the internal device 226. The encapsulation 230 having the encapsulation protrusions 106 can cover the second internal interconnect 222. The encapsulation 230 can extend through the openings 224 in the interposer 102 forming the encapsulation protrusions 106 having an extension height 232 from a top side 234 of the interposer 102. The encapsulation 230 can be horizontally bounded by a carrier horizontal dimension 236 of the carrier 212.

The interposer 102 can form an overhang 238 over the encapsulation 230, the carrier 212, or a combination thereof. An overhang height 240 of the overhang 238 is the distance between a carrier bottom side 242 of the carrier 212 and an interposer bottom side 244 of the interposer 102. Not included in the overhang height 240 are the heights or thicknesses of the interposer 102 and the encapsulation protrusions 106 covering the second internal interconnect 222 attached to the top side of the interposer 102.

It has been discovered that the present invention provides an integrated circuit package system having an overhanging interposer saves space by enabling manufactures to mount additional devices under the overhanging interposer. The overhanging interposer reduces the need for an interposer to stack additional devices over the integrated circuit package system.

Figure 3:
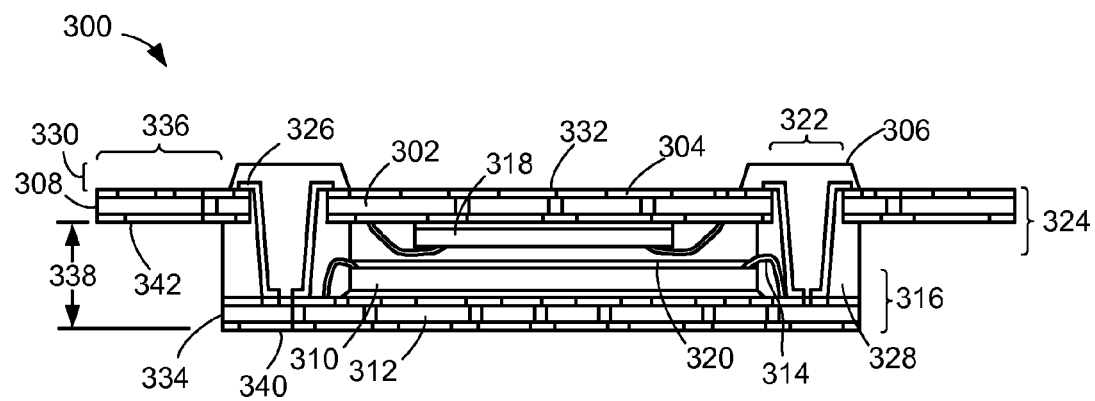
FIG. 3 is a cross-sectional view of an integrated circuit package system exemplified by the top view along line 2-2 of FIG. 1 in a second embodiment of the present invention.

Referring now to FIG. 3, therein is shown a cross-sectional view of an integrated circuit package system 300 exemplified by the top view along line 2-2 of FIG. 1 in a second embodiment of the present invention. A first integrated circuit 310, such as an integrated circuit die, can be over a carrier 312, such as a laminated substrate. A first internal interconnect 314, such as bond wire, can connect the carrier 312 to the first integrated circuit 310. A carrier assembly 316 can include the first integrated circuit 310, the carrier 312 and the first internal interconnect 314.

A second integrated circuit 318, such as a packaged integrated circuit, can be over the first integrated circuit 310 with an adhesive 320, such as a wire in film adhesive including a B-stage material, in between. The adhesive 320 can surround a portion of the first internal interconnect 314 adjacent to the connection with the first integrated circuit 310.

An interposer 302, such as a laminated substrate, having terminal pads 304 and openings 322 can be over the second integrated circuit 318. An interposer assembly 324 can include the second integrated circuit 318, the interposer 302, and the adhesive 320. A second internal interconnect 326, such as a copper gull wing or a rigid interconnect, can connect the interposer 302 with the carrier 312 through the openings 322 in the interposer 302.

An encapsulation 328, such as a cover including an epoxy molding compound, can be over the carrier 312 covering the second integrated circuit 318, the first integrated circuit 310, the first internal interconnect 314, and the second internal interconnect 326. The encapsulation 328 can extend through the openings 322 in the interposer 302 forming the encapsulation protrusions 306 having an extension height 330 from a top side 332 of the interposer 102. The encapsulation 328 can be horizontally bounded by a carrier horizontal dimension 334 of the carrier 312.

The interposer 302 can form an overhang 336 over the encapsulation 328, the carrier 312, or a combination thereof. An overhang height 338 of the overhang 336 is the distance between a bottom side of a carrier 340 and an interposer bottom side 342 of an interposer 302.

Figure 4:
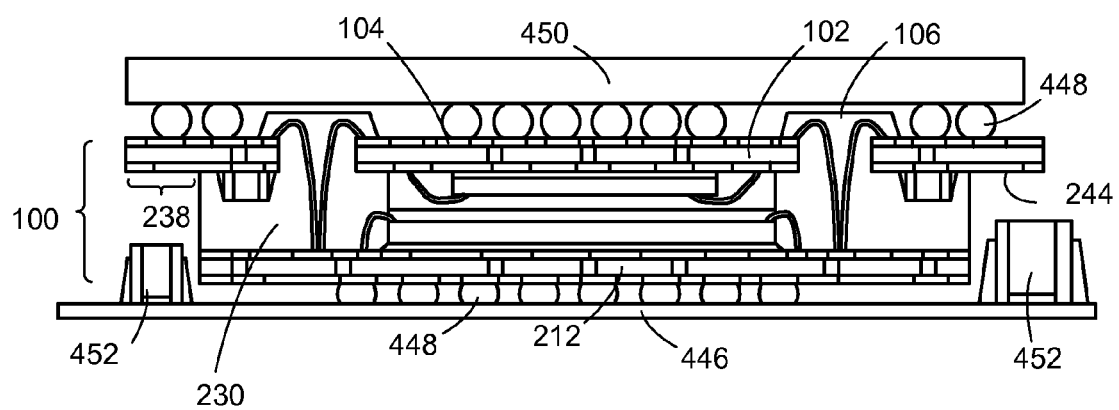
FIG. 4 is a cross-sectional view of the integrated circuit package system of FIG. 2 in a first example application.

Referring now to FIG. 4, therein is shown a cross-sectional view of the integrated circuit package system 100 of FIG. 2 in a first example application. The cross-sectional view depicts the integrated circuit package system 100 mounted over a mountable structure 446, such as a printed circuit board. External interconnects 448, such as solder balls, can connect the carrier 212 and the mountable structure 446.

A first device 450, such as a flip chip, can be over the integrated circuit package system 100. The first device 450 can be connected to the terminal pads 104 between the encapsulation protrusions 106 as well as the terminal pads 104 over the overhang 238 of the interposer 102. The overhang 238 provides additional mounting and connecting area for accommodating devices with larger footprint than the integrated circuit package system 100.

It has also been discovered that the present invention provides the integrated circuit package system that increases circuit density by providing an interposer having the overhang over the footprint of the integrated circuit package system. This allows a device with a larger footprint than the integrated circuit package system to be mounted thereover.

For illustrative purposes, the first device 450 is shown mounted over the integrated circuit package system 100, although it is understood that more than one device can be over the integrated circuit package system 100. The first device 450 can be pre-tested to ensure a known good device (KGD) without assembly with the integrated circuit package system 100.

A second device 452, such as a passive component, can be under the overhang 238 of the integrated circuit package system 100 and mounted over the mountable structure 446. For illustrative purposes, the second device 452 is shown under the overhang 238 and adjacent to the encapsulation 230 of the integrated circuit package system 100, although it is understood that the second device 452 may be placed differently. For example, the second device 452 may not be entirely under the overhang 238 and can be partially under the overhang 238.

Also for illustrative purposes, the second device 452 is shown not in contact with the interposer bottom side 244, although it is understood that the second device 452 and the integrated circuit package system 100 can be connected. For example, the second device 452 can be mounted to the interposer 102 under the overhang 238. As another example, the second device 452 can be under the overhang 238 connecting the interposer 102 and the mountable structure 446.

Figure 5:
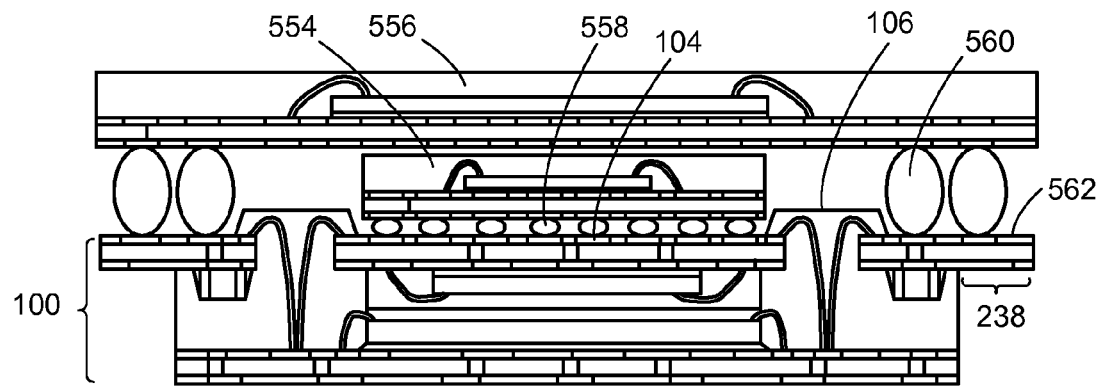
FIG. 5 is a cross-sectional view of the integrated circuit package system of FIG. 2 in a second example application.

Referring now to FIG. 5, therein is shown a cross-sectional view of the integrated circuit package system 100 of FIG. 2 in a second example application. The cross-sectional view depicts a first device 554, such as a packaged integrated circuit, over the integrated circuit package system 100 and a second device 556 over the first device 554, such as a packaged integrated circuit, and the integrated circuit package system 100. The first device 554 and the second device 556 can be connected to the terminal pads 104 of the integrated circuit package system 100 with first external interconnects 558, such as solder balls, and with second external interconnects 560, such as solder balls, respectively.

For illustrative purposes, the first device 554 is shown over the interposer 102 and between the encapsulation protrusions 106 in the interposer, although it is understood that the first device 554 can be placed elsewhere over the interposer 102. For example, the first device 554 can be over one of the encapsulation protrusions 106. For further illustrative purposes, the second device 556 is shown with the second external interconnects 560 connected to the terminal pads 104 peripheral to the encapsulation protrusions 106 on a top side 562 of the overhang 238, although it is understood that the second device 556 can be connected in a different location over the interposer 102. For example, the second device 556 can connect with the terminal pads 104 between the encapsulation protrusions 106.

Figure 6:
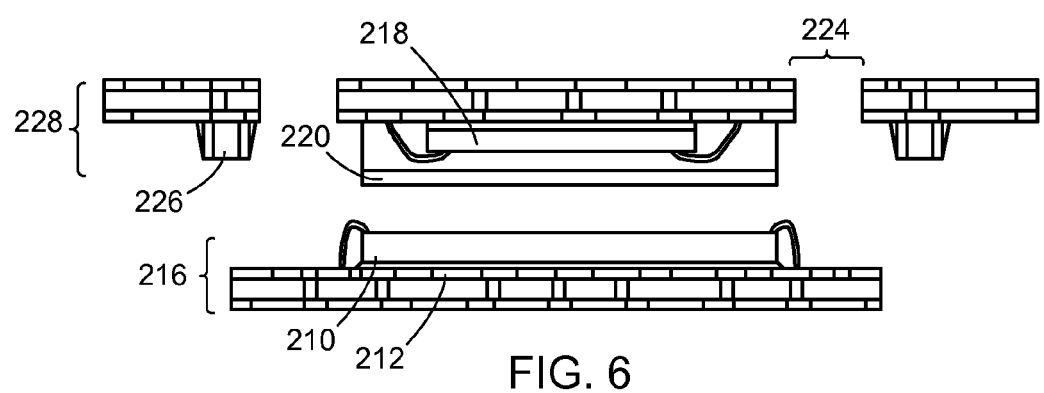
FIG. 6 is a cross-sectional view of the integrated circuit package system of FIG. 2 in mounting the interposer assembly.

Referring now to FIG. 6, therein is shown a cross-sectional view of the integrated circuit package system 100 of FIG. 2. The cross-sectional view depicts mounting of the interposer assembly 228 over the carrier assembly 216. The second integrated circuit 218 with the adhesive 220 attached thereto can be aligned over the first integrated circuit 210. The openings 224 can be over the carrier 212.

Figure 7:
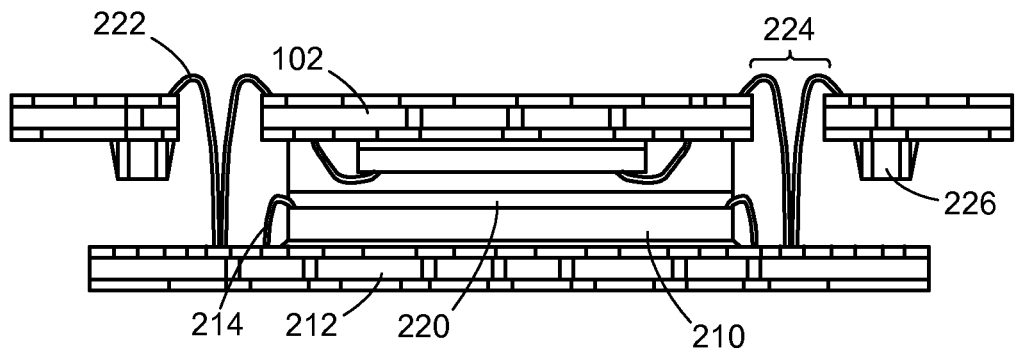
FIG. 7 is the structure of FIG. 6 in connecting the carrier and interposer.

Referring now to FIG. 7, therein is shown the structure of FIG. 6 in connecting the second internal interconnect 222 between the interposer 102 and the carrier 212. The second internal interconnect 222 connects the carrier 212 and the interposer 102 through the openings 224. The adhesive 220 can surround a portion of the first internal interconnect 214 adjacent to the connection with the first integrated circuit 210.

Figure 8:
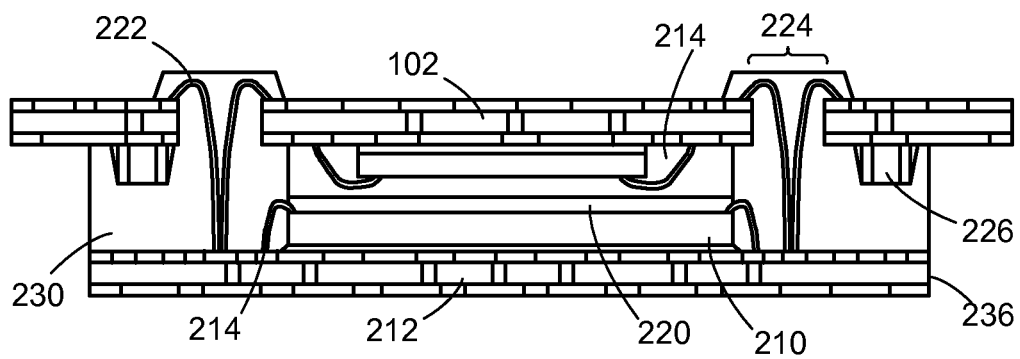
FIG. 8 is the structure of FIG. 7 in forming the encapsulation.

Referring now to FIG. 8, therein is shown the structure of FIG. 7 in forming the encapsulation 230. The encapsulation 230 can be over the carrier 212 covering the second integrated circuit 218, the first integrated circuit 210, the first internal interconnect 214, the second internal interconnect 222, and the internal device 226. The encapsulation 230 having the encapsulation protrusions 106 can cover the second internal interconnect 222. The encapsulation 230 can extend through the openings 224 in the interposer 102 to form the encapsulation protrusions 106. The encapsulation 230 can be formed to be horizontally bounded by a horizontal dimension of the carrier 236.

Figure 9:
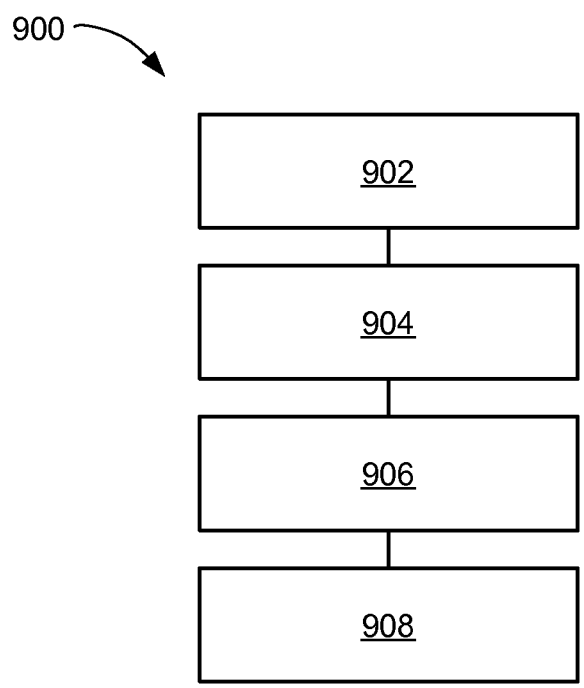
FIG. 9 is a flow chart of an integrated circuit package system for manufacture of the integrated circuit package system in an embodiment of the present invention.

Referring now to FIG. 9, therein is shown a flow chart of an integrated circuit package system 900 for manufacture of the integrated circuit package system 100 in an embodiment of the present invention. The system 900 includes mounting a first integrated circuit over a carrier in a block 902; mounting an interposer, having an opening, over the first integrated circuit and the carrier with the interposer having an overhang over the carrier in a block 904; connecting an internal interconnect, through the opening, between the carrier and the interposer in a block 906; and forming an encapsulation over the first integrated circuit, the internal interconnect, and the carrier in a block 908.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a carrier;
   mounting a first integrated circuit over the carrier;
   attaching an internal interconnect to the first integrated circuit and the carrier;
   mounting a second integrated circuit over the first integrated circuit with an adhesive around a portion of the internal interconnect and facing the first integrated circuit on a side opposite the carrier;
   mounting an interposer, having an opening, over the second integrated circuit on a side opposite the first integrated circuit, the interposer having an overhang over the carrier, the carrier extending laterally beyond the opening;
   connecting a second internal interconnect, through the opening, between the carrier and the interposer; and
   forming an encapsulation over the first integrated circuit, the second internal interconnect, and the carrier.

2. The method as claimed in claim 1 wherein forming the encapsulation includes filling the opening of the interposer with the encapsulation.

3. The method as claimed in claim 1 further comprising mounting a device below the overhang of the interposer.

4. The method as claimed in claim 1 further comprising mounting a device over the interposer.

5. The method as claimed in claim 1 wherein connecting the second internal interconnect includes connecting the second internal interconnect through the opening and between the carrier and a top side of the interposer.

6. A method for manufacturing an integrated circuit package system comprising:
   providing a carrier;
   mounting a first integrated circuit over the carrier;
   attaching an internal interconnect to the first integrated circuit and the carrier;
   mounting a second integrated circuit over the first integrated circuit with an adhesive around a portion of the internal interconnect and facing the first integrated circuit on a side opposite the carrier;
   mounting an interposer, having an opening, over the second integrated circuit on a side opposite the first integrated circuit, the interposer having an overhang over the carrier, the carrier extending laterally beyond the opening;
   connecting a second internal interconnect, through the opening, between the carrier and the interposer; and
   forming an encapsulation over the first integrated circuit, the second internal interconnect, and the carrier with the interposer having the overhang over the encapsulation.

7. The method as claimed in claim 6 wherein forming the encapsulation includes forming an encapsulation protrusion.

8. The method as claimed in claim 6 further comprising mounting a device over the overhang of the interposer.

9. The method as claimed in claim 6 further comprising:
   mounting a first device over the interposer; and
   mounting a second device over the overhang of the interposer.

10. The method as claimed in claim 6 further comprising:
    mounting an internal device under the interposer; and
    wherein forming the encapsulation includes:
    covering the internal device with the encapsulation.

11. An integrated circuit package system comprising:
    a carrier;
    a first integrated circuit over the carrier;
    an internal interconnect attached to the first integrated circuit and the carrier;
    a second integrated circuit over the first integrated circuit with an adhesive around a portion of the internal interconnect and facing the first integrated circuit on a side opposite the carrier;
    an interposer, having an opening, over the second integrated circuit on a side opposite the first integrated circuit, the interposer having an overhang over the carrier, the carrier extending laterally beyond the opening;
    a second internal interconnect, through the opening, between the carrier and the interposer; and
    an encapsulation over the first integrated circuit, the second internal interconnect, and the carrier.

12. The system as claimed in claim 11 wherein a portion of the encapsulation extends through the opening of the interposer.

13. The system as claimed in claim 11 further comprising a device below the overhang of the interposer.

14. The system as claimed in claim 11 further comprising a device over the interposer.

15. The system as claimed in claim 11 wherein the second internal interconnect includes a second internal interconnect through the opening and between the carrier and a top side of the interposer.

16. The system as claimed in claim 11 wherein the interposer has the overhang over the encapsulation.

17. The system as claimed in claim 16 wherein the encapsulation includes an encapsulation protrusion.

18. The system as claimed in claim 16 further comprising a device over the overhang of the interposer.

19. The system as claimed in claim 16 further comprising:
    a first device over the interposer; and
    a second device over the overhang of the interposer.

20. The system as claimed in claim 16 further comprising:
    an internal device under the interposer; and
    wherein the encapsulation includes the internal device therein.

* * * * *